(12) United States Patent
Noshita

(10) Patent No.: US 6,525,412 B2
(45) Date of Patent: Feb. 25, 2003

(54) SEMICONDUCTOR DEVICE HAVING CHIP SCALE PACKAGE

(75) Inventor: Kazuyuki Noshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/007,165

(22) Filed: Nov. 30, 2001

(65) Prior Publication Data

US 2002/0063264 A1 May 30, 2002

(30) Foreign Application Priority Data

Nov. 30, 2000 (JP) ......................................... 2000-364613
Nov. 26, 2001 (JP) ......................................... 2001-369997

(51) Int. Cl.[7] ............................................... H01L 23/02
(52) U.S. Cl. .................... 257/678; 257/668; 257/680; 257/779; 257/780; 257/784; 324/755
(58) Field of Search ............................... 257/668, 680, 257/779, 780, 784; 324/755

(56) References Cited

U.S. PATENT DOCUMENTS 5,920,118 A  7/1999 Kong
6,285,203 B1 * 9/2001 Akram et al. ................. 324/755
6,342,726 B2 * 1/2002 Miyazaki et al. ............ 257/668
6,376,279 B1 * 4/2002 Kwon et al. .................. 257/772

FOREIGN PATENT DOCUMENTS

JP   2891665     2/1999
JP   11-87414    3/1999
JP   11-186449   7/1999

* cited by examiner

Primary Examiner—David Nelms
Assistant Examiner—Mai-Huong Tran
(74) Attorney, Agent, or Firm—Hogan & Hartson, LLP

(57) ABSTRACT

A first surface of a semiconductor chip and an upper surface of a circuit board are bonded with a pad of the semiconductor chip fitted to a first opening of the circuit board. The pad is electrically connected to a wire of the circuit board. The pad is sealed with a first resin. A second resin is disposed on the upper surface of the circuit board. A second resin includes an upper surface at a height substantially equal to a height of a second surface of the semiconductor chip at a point apart from a corner of a square of the first surface of the semiconductor chip.

15 Claims, 15 Drawing Sheets

SEMICONDUCTOR DEVICE HAVING CHIP SCALE PACKAGE

CROSS REFERENCE TO RELATED APPLICATIONS

This application is based upon and claims the benefit of priority from prior Japanese Patent Applications P2000-364613 and P2001-359997 filed on Nov. 30, 2000 and Nov. 26, 2001; the entire contents of which are incorporated by reference herein.

BACKGROUND OF THE INVENTION

The present invention relates to a semiconductor device of a Chip Scale Package (CSP). Particularly, the present invention relates to a semiconductor device, a surface of which is exposed to the outside.

In recent years, high-speed operation has been required of a semiconductor device. Particularly, in a dynamic random access memory (DRAM), high-speed operation at several 100 MHz level is required. Therefore, a flip chip type semiconductor device has been used such that a surface of a semiconductor chip thereof is exposed to the outside. Further, this type of semiconductor device is required to be downsized and be thin. Therefore, a semiconductor device of a ball grid array (BGA) type has been manufactured. In the semiconductor device of a BGA type, it is possible to package a chip scale. In these semiconductors, a protective resin coats only a portion of the semiconductor chip. In these semiconductors, a surface of a semiconductor chip is exposed to the outside.

However, according to earlier semiconductor devices, there have been cases where a corner portion of the semiconductor chip is damaged and electrical failure occurs in the semiconductor device. It has been supposed that damage is caused by what can be described as the low strength of the semiconductor device.

SUMMARY OF THE INVENTION

A semiconductor device according to embodiments of the present invention includes a semiconductor device comprising, a semiconductor chip including a pad disposed on a square first surface, a circuit board including upper surface contacting with the first surface of said semiconductor chip, including a first opening arranged below the pad, and including a wire arranged on a lower surface and electrically connected to the pad, a first resin arranged on the first opening and coating the pad, and a second resin disposed on the upper surface of said circuit board, and including an upper surface at a height substantially equal to a height of a second surface of said semiconductor chip at a point apart from a corner of the square first surface of said semiconductor chip.

DETAILED DESCRIPTION OF EMBODIMENTS

Figure 1A:
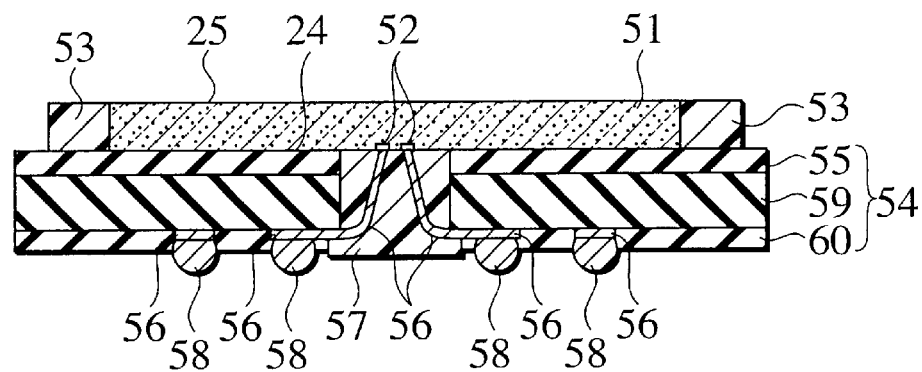
FIG. 1A and FIG. 1B are cross sectional views of a semiconductor device capable of preventing damage to corner portions of a semiconductor chip.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Constitution A)

As shown in FIG. 1A, according to a semiconductor device having a constitution A, a pad 52 is provided on a square first surface 24 of a semiconductor chip 51. In the following description, the word "square" refers to square and rectangle. A top surface of a circuit board 54 contacts with the first surface 24 of the semiconductor chip 51. The circuit board 54 has an opening under the pad 52. A wire 56 is arranged on a lower surface of the circuit board 54. The wire 56 is electrically connected to the pad 52. A first resin 57 is embedded in an opening of the circuit board 54. The first resin 57 coats the pad 52. A bump 58 is located under the wire 56 and is electrically connected to the wire 56. The circuit board 54 has a lamination layer. An elastomer 55 is provided on an upper layer thereof. Under the elastomer 55, an insulative base material 59 is partially provided. Under the insulative base material 59, the wire 56 is partially provided. Under the insulative base material 59 and the wire 56, an insulative protection film 60 is provided.

A second resin 53 is provided on an upper surface of the circuit board 54. The upper surface of the second resin 53 is of a height substantially equal to that of a second surface 25 of the semiconductor chip 51 even in places where the upper surface of the second resin 53 is distanced from the corner portion of the semiconductor chip 51. The upper surface of the second resin 53 and the second surface 25 of the semiconductor chip 51 are arranged on a single surface. Further, the second resin 53 contacts with the outer periphery of the second surface 25 of the semiconductor chip 51.

By providing the second resin 53, the corner portion of the semiconductor chip 51 hardly contact with the inspection device and the tray. Further, it is possible to prevent damage of the corner portion of the semiconductor chip 51. Alternatively, it is possible to reduce the area where the second resin 53 on the upper surface of the circuit board 54 contacts with the outer periphery of the second surface 25 of the semiconductor chip 51. Accordingly, it is possible to reduce the quantity of the second resin 53.

(Constitution B)

Figure 1B:
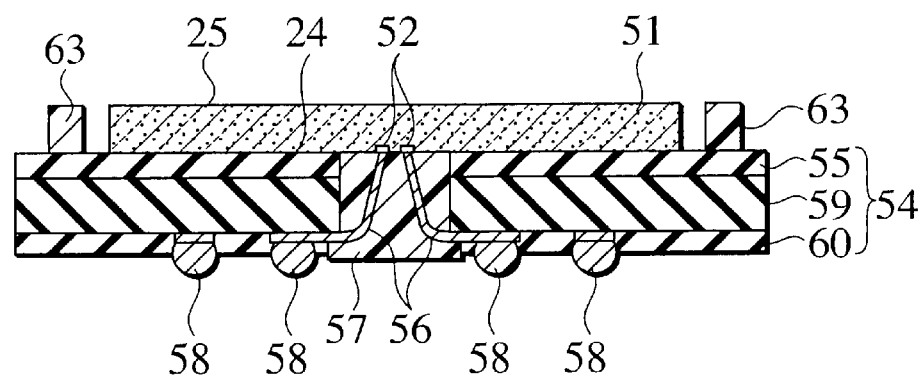

As shown in FIG. 1B, a semiconductor device having a constitution B is different from the semiconductor device having the constitution A only in the constitution of a second resin 63.

The second resin 63 is provided on an upper surface of the circuit board 54. An upper surface of the second resin 63 has a height substantially equal to that of a second surface 25 of the semiconductor chip 51 even in places where the upper surface of the second resin 63 is apart from the corner portion of the semiconductor chip 51. The upper surface of the second resin 63 and the second surface 25 of the semiconductor chip 51 are arranged on a single plane. Further, the second resin 63 contacts with the outer periphery of the semiconductor chip 51. Particularly, the second resin 63 does not contact with the outer periphery of the second surface 25.

By providing the second resin 63, the corner portion of the semiconductor chip 51 hardly contacts with the inspection device and the tray. Further, it is possible to prevent damage to the corner portion of the semiconductor chip 51.

First Embodiment

According to a first embodiment, a semiconductor device having the constitution A will be described.

Figure 2A:
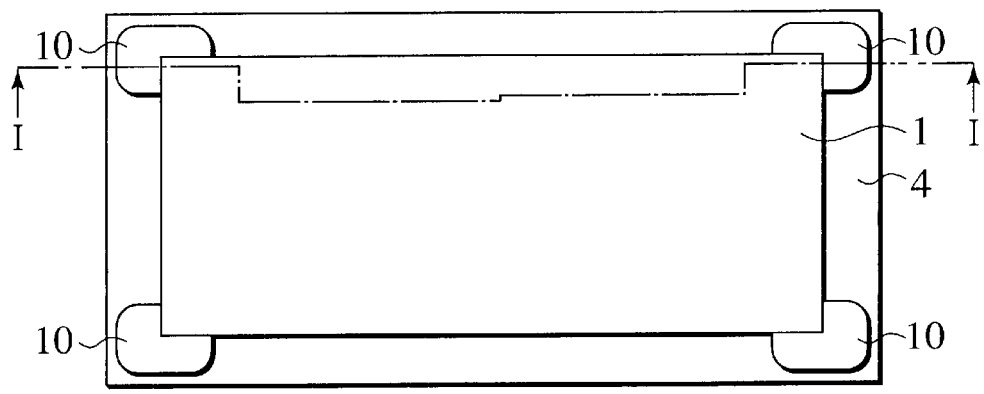
FIG. 2A is a top view of a semiconductor device according to a first embodiment.
Figure 2B:
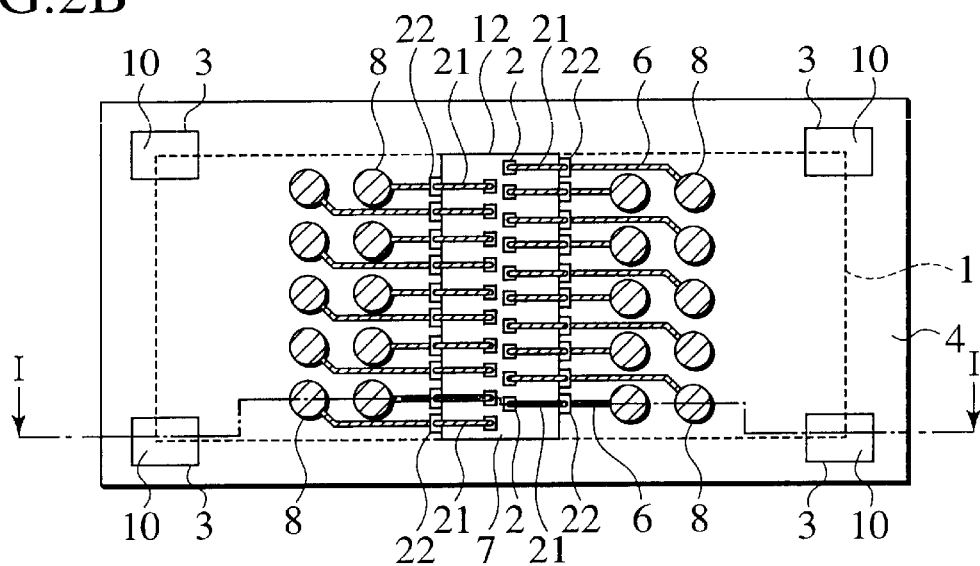
FIG. 2B is a bottom view of a semiconductor device according to a first embodiment.
Figure 2C:
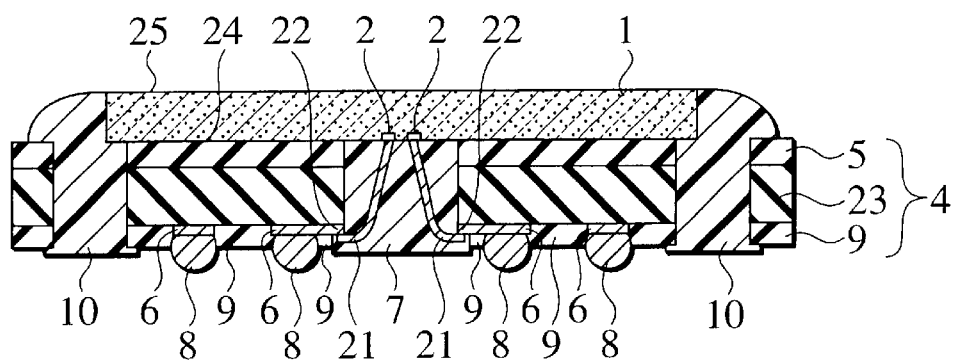
FIG. 2C is a cross sectional view in the I—I direction of FIG. 2A and FIG. 2B.

As shown in FIG. 2A, FIG. 2B and FIG. 2C, in the semiconductor device according to a first embodiment, a pad 2 is provided on the first surface 24 of a semiconductor chip 1. The first surface 24 is a square.

An upper surface of a circuit board 4 contacts with a first surface 24 of the semiconductor chip 1. The circuit board 4 under the pad 2 has a first opening 12. A wire 6 is arranged on a lower surface of the circuit board 4 and the wire 6 is electrically connected to the pad 2. A first resin 7 is provided on a first opening 12. The first resin 7 coats the pad 2 and a wire 21. A second resin 10 is provided to an upper surface of the circuit board 4. An upper surface of the second resin 10 has a height substantially equal to that of a second surface 25 of the semiconductor chip 1 when the upper surface of the second resin 10 is distanced from the corner portion of the semiconductor chip 1. A second opening 3 is provided to the circuit board 4. The second opening 3 is further provided in the vicinity of the corner portion of the first surface 24 of the semiconductor chip 1. The second resin 10 is also injected into the second opening 3. The upper surface of the second resin 10 and the second surface 25 of the semiconductor chip 1 are arranged on a single plane. The second resin 10 contacts with the outer periphery of the second surface 25 of the semiconductor chip 1. The corner portion of the first surface 24 of the semiconductor chip 1 is arranged above the second opening 3. The pad 2 is provided in the vicinity of a centerline perpendicular to the side of the square on the first a surface 24 of the semiconductor chip 1. The shape of the opening face of the second opening 3 is a square, however, it may be a circle or a polygon. Further, the shape may be different for each opening. A bump 8 is arranged below the wire 6. The bump 8 is electrically connected to the wire 6. The pad 2 is electrically connected to the wire 6 through the wire 21. The wire 6 is connected to the wire 21 at a bonding pad 22.

A main surface 24 of the semiconductor chip 1 comprises a square having four sides. In the semiconductor chip 1, a plurality of center pads 2 are provided on a surface of an area in the vicinity of a center line perpendicular to the longitudinal direction of this square. The center pads 2 are linearly arranged in two rows.

By providing the second resin 10, the corner portion of the semiconductor chip 1 hardly contacts with the inspection device and the tray. Further, it is possible to prevent damage to the corner portion of the semiconductor chip 1. In this case, in order to protect the corner portion of the semiconductor chip 1, it is preferable that the second surface 25 of the semiconductor chip 1 and the upper surface of the second resin 10 of the corner portion are arranged on a single plane. Further, it is preferable that the upper surface of the second resin 10 of the corner portion protrudes higher than the second surface 25 of the semiconductor chip 1. However, to avoid the semiconductor device becoming thick, the upper surface of the second resin 10 protrudes within a reasonable range of thickness. If the upper surface of the second resin 10 protrudes excessively, when installing the semiconductor device in a socket, it becomes an obstacle. It is preferable that there is a limit to the extent of the protrusion.

The semiconductor device is highly integrated. A memory cell in the semiconductor chip is formed in an area other than the vicinity of a centerline of the semiconductor chip. Further, a peripheral circuit is provided along the centerline of the semiconductor chip. According to a center pad system, it is possible to provide a pad in the area closest to the peripheral circuit. The center pad system is preferable in order to keep the length of the wire short.

Circuit elements are formed on the first surface 24 of the semiconductor chip 1, on which respective pads 2 are placed. The second surface 25 at the opposite side of the first surface 24 on the semiconductor chip 1 is face up. The pad 2 is electrically connected to the ball bump 8. The ball bump 8 is provided to a rear surface of the circuit board 4. Further, the second opening 3 is provided in the vicinity of the four corner portions of the first surface 24 of the semiconductor chip 1. The center pad 2 is connected to the ball bump 8 by the wire 6. The first resin 7 coats the wire 6 and the center pad 2.

Four pieces of the second openings 3 in the circuit board 4 and four corner portions of the semiconductor chip 1 are coated by the second resin 10 up to the second surface 25 of the semiconductor chip 1. The second resin 10 coats the periphery of four corner portions of the semiconductor chip 1. The size of a side of a square at an opening surface of the opening 3 is, for example, about 1.6 mm. Alternatively, the thickness of the semiconductor chip 1 is, for example, about 380 $\mu$m.

As described above, according to the semiconductor device of the first embodiment, even if a surface of the semiconductor chip is exposed to the outside, it is possible to prevent damage to the corner portions of the semiconductor chip.

Next, a manufacturing method of the semiconductor device according to the first embodiment will be described below. Additionally, a manufacturing method of the semiconductor device according to the first embodiment is more easily understood by arranging it back to front.

Figure 3A:
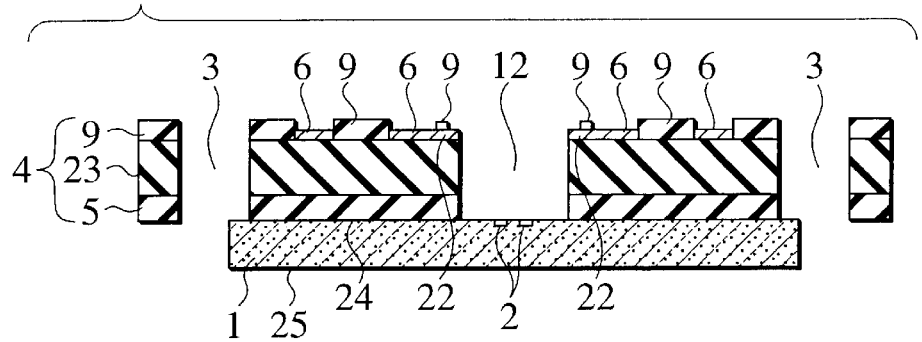
FIGS. 3A to 3D are cross sectional views of a semiconductor device according to the first embodiment during a manufacturing process.

(1) First, as shown in FIG. 3A, the pads 2 of the semiconductor chip 1 agree with the first opening 12 of the circuit board 4. The second opening 3 of the circuit board 4 is provided in the vicinity of the corner portion on the first surface 24 or the second surface 25 of the semiconductor chip 1. Then, the first surface 24 of the semiconductor chip 1 and the upper surface of the circuit board 4 are bonded to each other. The opening 3 is formed beforehand on a portion of the circuit board 4, to which the corner portion of the semiconductor chip 1 is arranged. The circuit board 4 and the semiconductor chip 1 are joined to each other by an elastomer (an adhesive) 5.

Figure 3B:
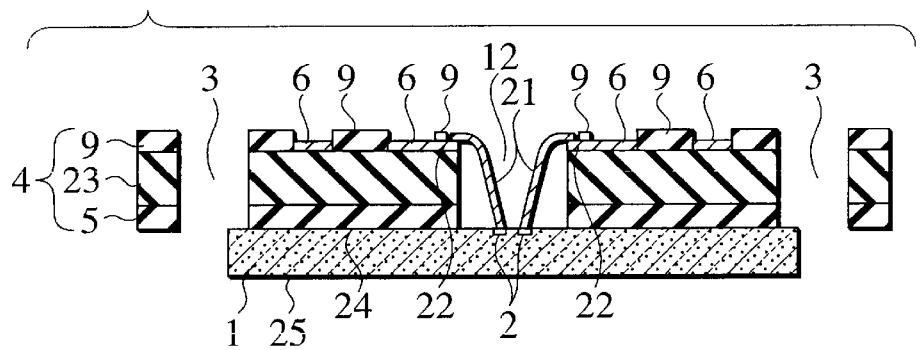

(2) Next, as shown in FIG. 3B, the pad 2 is electrically connected to the wire 6 of the circuit board 4 by the wire 21. The center pad 2 of the semiconductor chip 1 is connected to the circuit board 4 by the wire 21 such as a beam lead or a metal wire or the like.

Figure 3C:
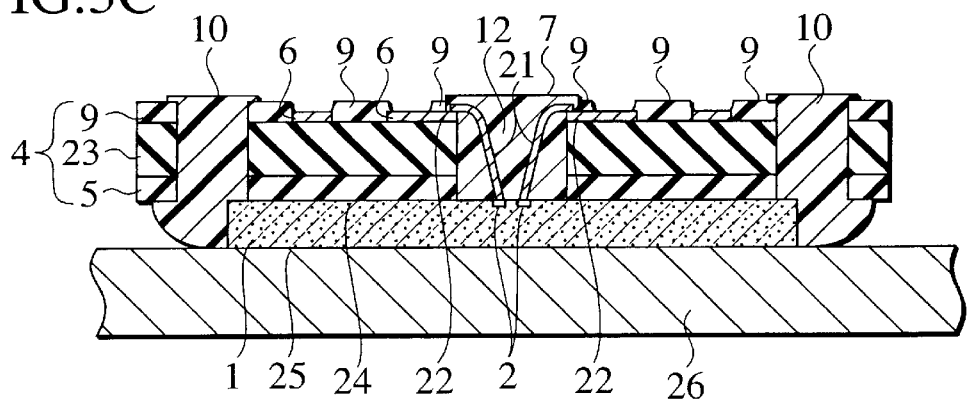

(3) As shown in FIG. 3C, the first opening 12 is filled with the first resin 7, so that the pad 2, the wire 21 and the bonding pad 22 are sealed. At the same time, on the upper surface of the circuit board 4, the second resin 10 is formed. The second opening 3 is filled with the second resin 10. From the side of an insulative protection film 9 of the circuit board 4, the first resin 7 is injected into the opening 12 of a wiring junction 4 and the second resin 10 is injected into the opening 3. The upper surface of the second resin 10 has a height substantially equal to that of the second surface 25 of the semiconductor chip 1 even in places where the upper surface of the second resin 10 is distanced from the square corner portion of the first surface 24 of the semiconductor chip 1. In order to do so, a mold 26 having a flat surface is used, so that the flat surface of the mold 26 adheres to the second surface 25 of the semiconductor chip 1. After this adhesion, the second resin 10 is injected into the second opening 3 from a lower surface of the circuit board 4, which is located above the second opening 3. Some of the injected second resin 10 reaches to the side face of the semiconductor chip 1 and a flat surface of the mold 26. If the second resin 10 reaches to the mold 26, it is possible to make the upper surface of the second resin 10 have a height substantially equal to that of the second surface 25 of the semiconductor chip 1 even in places where the upper surface of the second resin 10 is distanced from the corner portions of the second surface 25 of the semiconductor chip 1. Injecting with the first resin 7 and injecting with the second resin 10 are the same in view of their injection from the lower surface of the circuit board 4 toward the upper surface thereof, so that it is possible to inject the first resin 7 and the second resin 10 simultaneously.

Figure 3D:
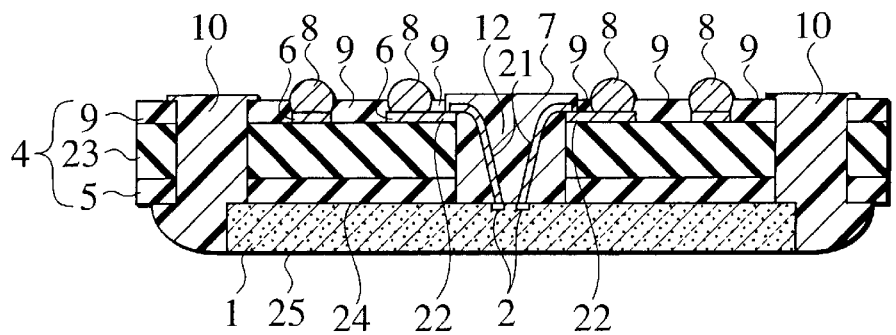

(4) As shown in FIG. 3D, the ball bump 8 is bonded to the wire 6. Then, the ball bump 8 is electrically connected. Further, a ball 8 as an outer connecting terminal is formed on the wire 6 of the circuit board 4. Alternatively, it is possible to execute this step (4) before or after the steps (1), (2) and (3).

By such sealing with resin in step (3), the non-conductive resin 10 sufficiently coats the side face of the semiconductor chip 1 at the corner portion of the semiconductor chip 1. Thereby, the resin 10 protects the semiconductor chip 1 so that it is not damaged. Incidentally, a method for sealing with the second resin is different from the step (3) and it is also possible to seal the resin from a direction from the side of the second surface of the semiconductor chip 1, particularly, from a direction toward the side of the semiconductor chip 1.

According to the semiconductor device in which the semiconductor chip 1 is exposed to the outside, the opening 3, which is not coated totally by the semiconductor chip 1, is provided to a portion of the circuit board 4 which is not covered by the semiconductor chip 1. Thereby, it is possible to form the protective resin 10 on the connecting portion (ball bump) 8 to the outer wiring from the side.

The opening 3 is provided so that it contacts with the side face of the semiconductor chip 1. Thereby, the protective resin 10 is formed on the side face of the semiconductor chip 1. This protective resin 10 enables the prevention of damage to the semiconductor chip 1 and improves the strength and the reliability of the semiconductor device. Alternatively, even in a case where the opening 3 is provided at a portion of the circuit board 4 distanced from the side face of the semiconductor chip 1, the semiconductor chip 1 hardly contacts with the outside, so that it is possible to prevent the corner portions of the semiconductor chip 1 from being damaged.

Therefore, it is possible to form the protective resin 10 from the side of the first surface 24 of the semiconductor chip 1. Hereby, the resin 10 is capable of being formed by the same step as that of the sealing of the wire connecting portions 2, 21 and 22 with the resin 7. On the circuit board 4, the opening 12 is formed in order to connect the wire 6 with the pad 2. It is possible to form the opening 3 on the circuit board 4 according to the same step as that for the opening 12.

Responding to the demand of the high speed operation, the pads 2 are collectively arranged at the center of the semiconductor chip 1. The mounting board 4 is electrically connected to the semiconductor chip 1 only at the center portion of the semiconductor chip 1. It is possible to attain such protection for the pad 2 of the semiconductor chip 1 and the protection of the corner portion of the semiconductor chip 1 by inserting the resins 7 and 10 from the same side face. The number of the steps is not increased depending on this insertion.

Further, FIGS. 3A to 3C illustrate an example of a semiconductor device of a fan in type such that all of the balls 8 are sealed in a direction directly below the semiconductor chip 1. However, the first embodiment can also be applied to a fan out type of the semiconductor device. According to a fan out type of the semiconductor device, the ball 8 is also provided at the outside in a direction directly below the semiconductor chip 1. In this case, the opening 3 to be provided in the circuit board 4 is provided in a position where the ball 8 is not provided. Alternatively, the ball 8 is provided in a position where the opening 3 is not provided.

As described above, according to a manufacturing method of the semiconductor device according to the first embodiment, even if the surface of the semiconductor chip 1 is exposed to the outside, it is possible to prevent the corner portion of the semiconductor chip 1 from being damaged.

(Modified example of a first embodiment)

According to a modified example of a first embodiment, a semiconductor device having the constitution A will be described.

Figure 4A:
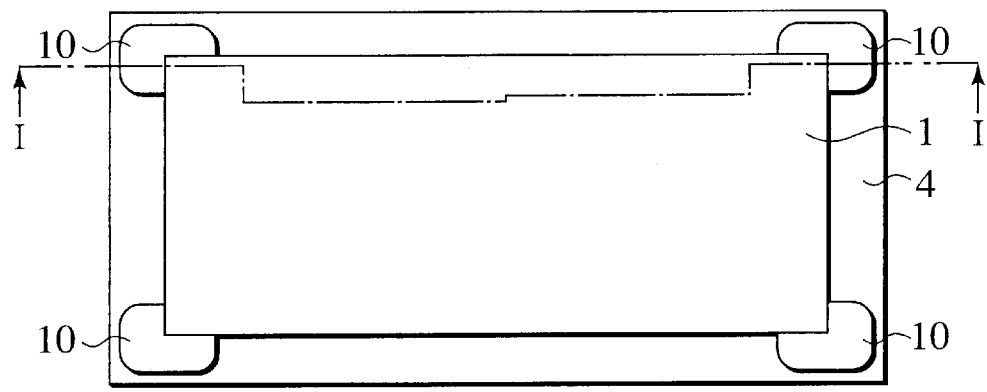
FIG. 4A is a top view of a semiconductor device according to a modified example of a first embodiment.
Figure 4B:
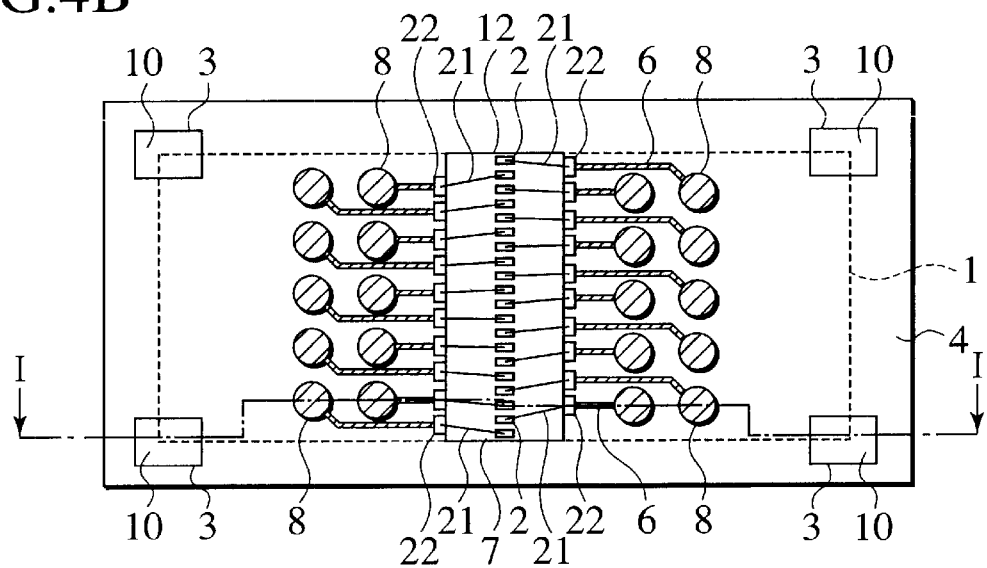
FIG. 4B is a bottom view of a semiconductor device according to a modified example of a first embodiment.
Figure 4C:
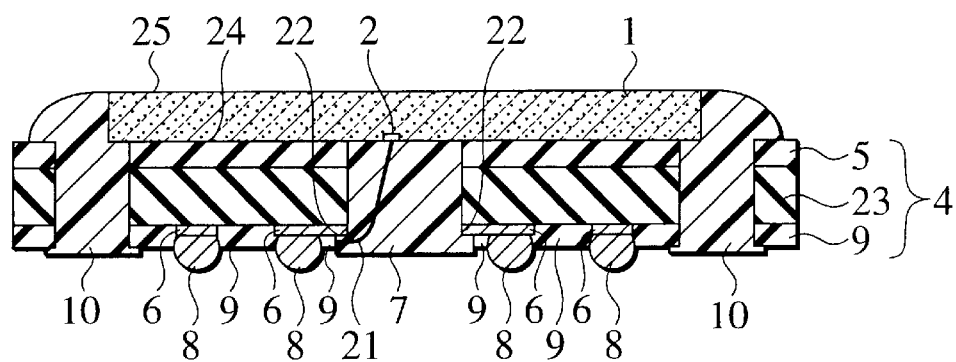
FIG. 4C is a cross sectional view in the I—I direction of FIG. 4A and FIG. 4B.

As shown in FIG. 4A, FIG. 4B and FIG. 4C, in the semiconductor device according to a modified example of a first embodiment, a main surface 24 of the semiconductor chip 1 comprises a square having four sides. In the semiconductor chip 1, a plurality of center pads 2 are provided on a surface of an area in the vicinity of a center line perpendicular to a longitudinal direction of this square. The semiconductor device of the modified example of a first embodiment is different from the semiconductor device of the first embodiment in that the center pads 2 are linearly arranged in one row. According to a center pad system, it is possible to provide a pad in the area closest to the peripheral circuit. The center pad system is preferable in order to keep the length of the wire short.

Second Embodiment

In the second embodiment, a semiconductor device having the constitution A will be described.

Figure 5A:
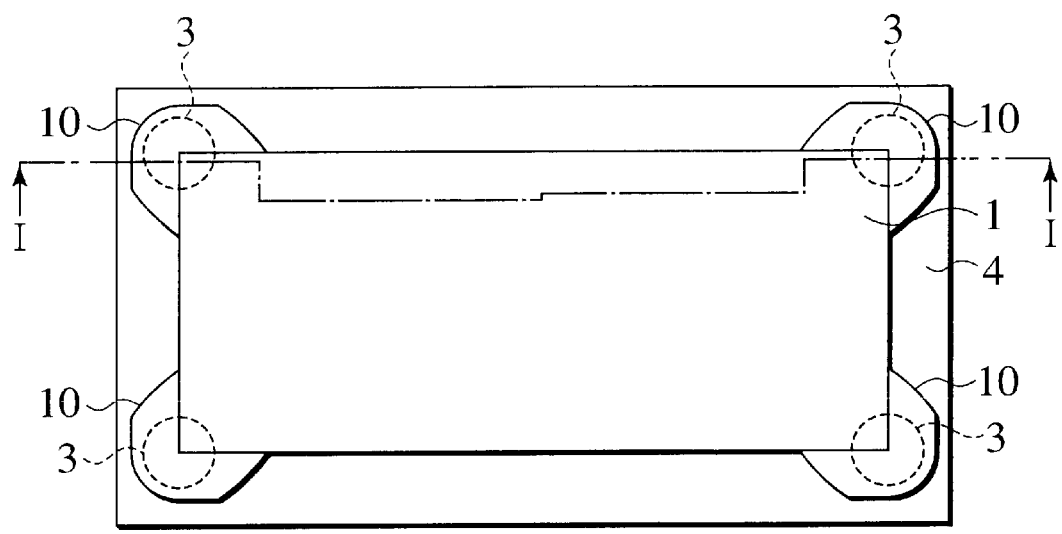
FIG. 5A is a top view of a semiconductor device according to a second embodiment.
Figure 5B:
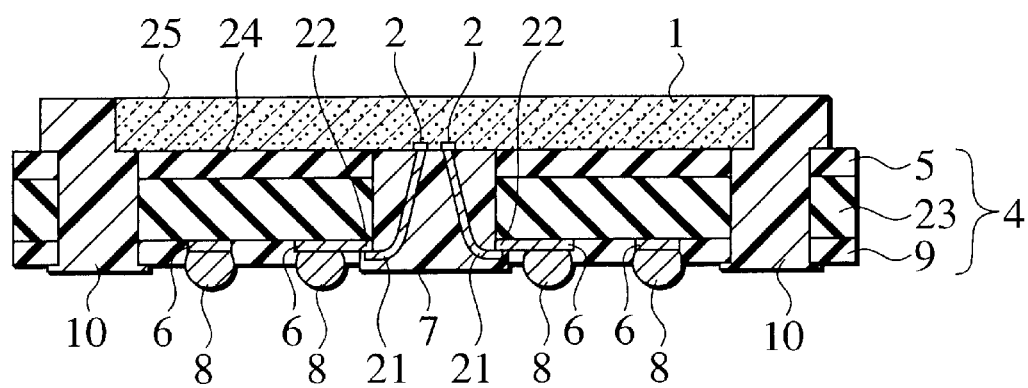
FIG. 5B is a cross sectional view of the I—I direction of FIG. 5A.

As shown in FIG. 5A and FIG. 5B, the semiconductor device of the second embodiment is different from the semiconductor device of the first embodiment in that the opening area of the second opening 3 is a circle. Further, the semiconductor device of the second embodiment is different from the semiconductor device of the first embodiment in that a side face of the second resin 10 on the circuit board 4, which does not contact with the side face of the semiconductor chip 1, is perpendicular to the second surface 25 of the semiconductor chip 1.

By providing the second resin 10, the corner portion of the semiconductor chip 1 hardly contacts with the inspection device and the tray. Further, it is possible to prevent damage to the corner portion of the semiconductor chip 1. Moreover, it is possible to reduce the upper surface of the circuit board 4, with which the second resin 10 contacts. Accordingly, it is possible to reduce the area of the circuit board 4 and the area of the semiconductor device. Further, if the shape of the opening area of the opening 3 is made into a circle, air bubbles are hardly generated upon injecting with the second resin 10.

Figure 6A:
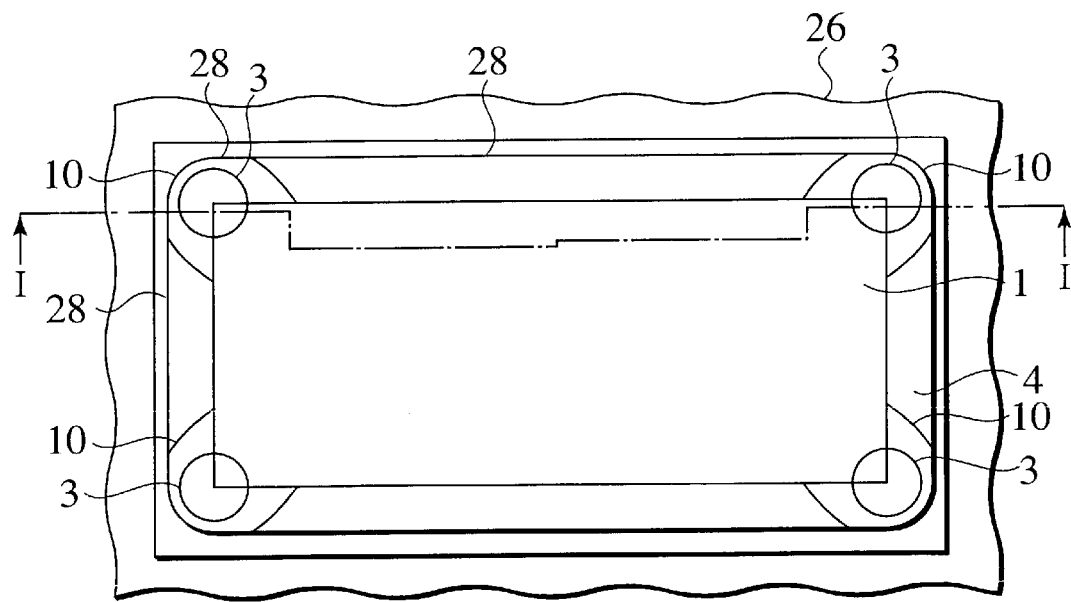
FIG. 6A is a transparent view of a semiconductor device from above according to the second embodiment, in which a mold 26 is arranged.
Figure 6B:
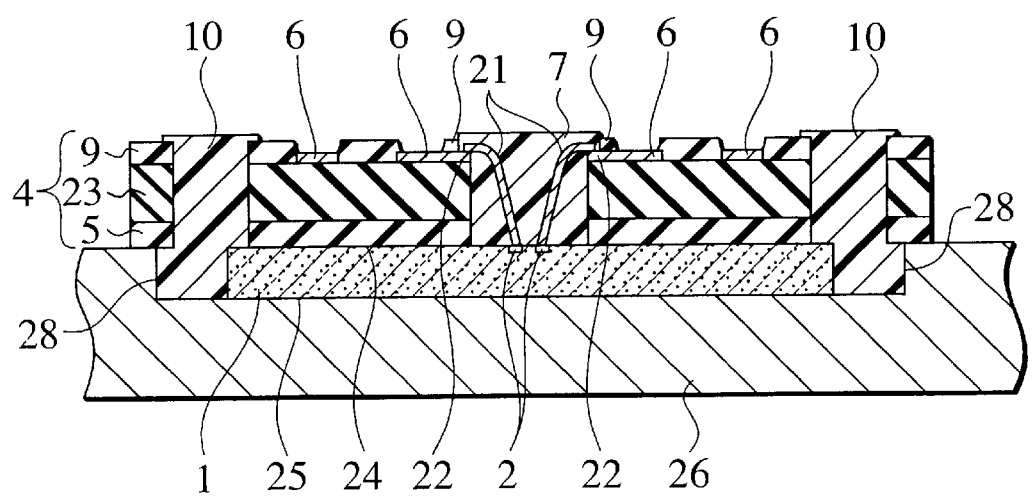
FIG. 6B is a cross sectional view of the I—I direction of FIG. 6A.

Next, a manufacturing method of the semiconductor device according to the second embodiment will be explained below. By changing the following two point, it is possible to execute the manufacturing method of the semiconductor device according to the second embodiment in the same way as the manufacturing method of the semiconductor device according to the first embodiment. First, the shape of the opening face of the opening 3 is changed into a circle in the step (1). Secondly, as shown in FIG. 6A and FIG. 6B, the shape of the mold 26 is changed and arranged in the step (4). A side face 28 is newly provided on the mold 26. The side face 28 is capable of being arranged perpendicularly to the second surface 25 of the semiconductor chip 1. Therefore, the side face 28 is arranged perpendicularly to the flat face of the mold 26 contacting with the second surface 25 of the semiconductor chip 1. One end of the side face 28 is capable of contacting with the circuit board 4. Therefore, the height of the side face 28 is defined as the same as the thickness of the semiconductor chip 1.

By providing the side face 28, it is possible to set the thickness of the second resin 10 as an arbitrary thickness. Therefore, it is possible to set the thickness of the second resin 10 as the minimum thickness of the film capable of preventing the corner portion of the semiconductor chip 1 from being damaged. Then, it is possible to reduce the upper surface of the circuit board 4 that the second resin 10 contacts with. Further, it is possible to reduce narrow the area of the circuit board 4 and the area of the semiconductor device.

Third Embodiment

In the third embodiment, a semiconductor device having the constitution A will be described in detail.

Figure 7A:
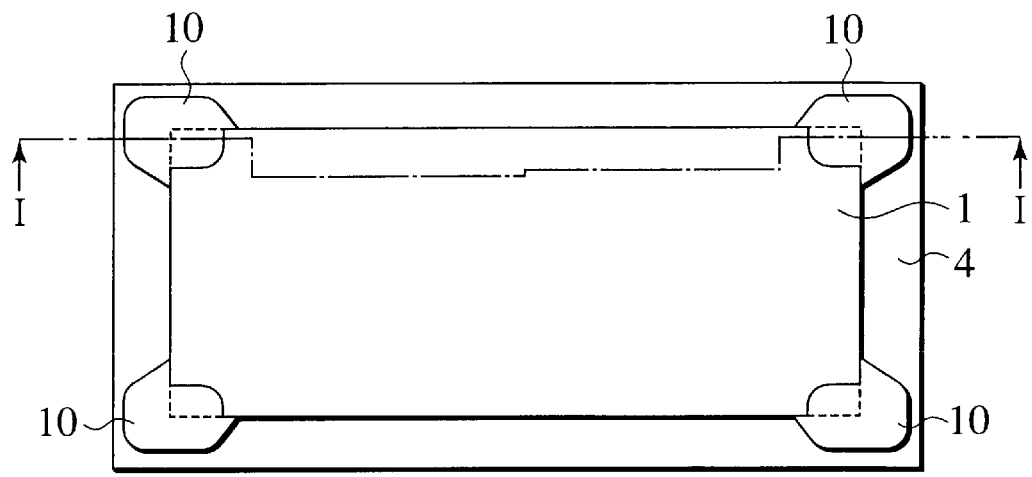
FIG. 7A is a top view of a semiconductor device according to a third embodiment.
Figure 7B:
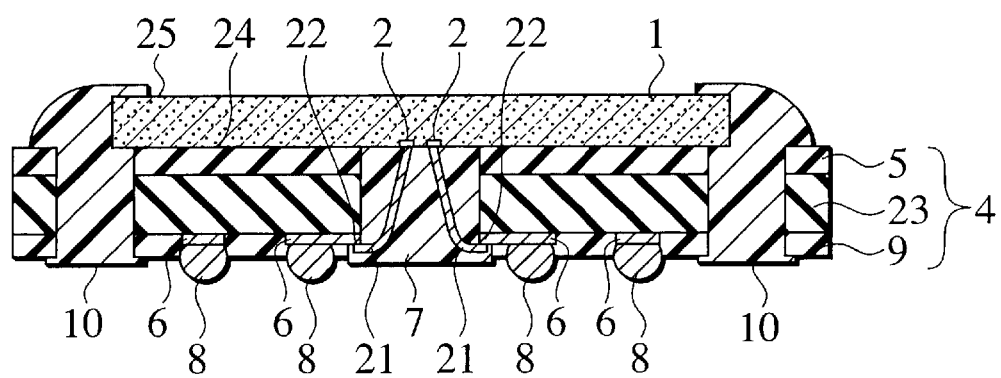
FIG. 7B is a cross sectional view of the I—I direction of FIG. 7A.

As shown in FIG. 7A and FIG. 7B, the semiconductor device according to the third embodiment is different from the semiconductor device according to the first embodiment in that the second resin 10 is provided to the second surface 25 of the corner portion of the semiconductor chip 1.

The second resin 10 is also arranged on the second surface 25 of the semiconductor chip 1. Hereby, the corner portion of the semiconductor chip 1 is completely coated with the second resin 10. The corner portion of the semiconductor chip 1 never contacts with the inspection device and the tray. Thereby, it is possible to prevent the corner portion of the semiconductor chip 1 from being damaged.

Figure 8A:
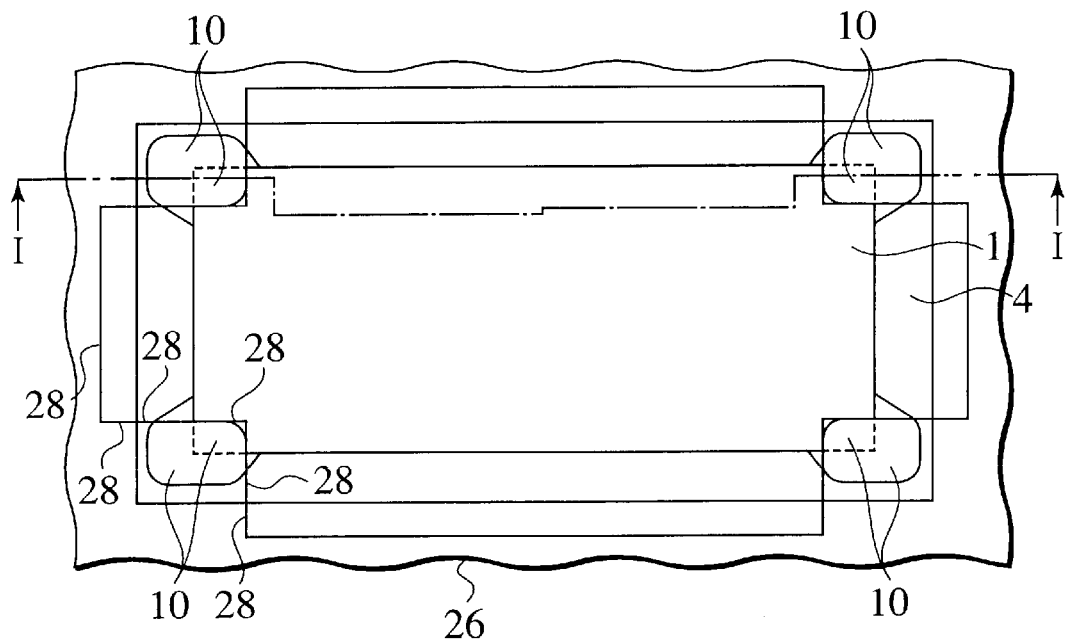
FIG. 8A is a transparent view from above of a semiconductor device according to the third embodiment, in which a mold 26 is arranged.
Figure 8B:
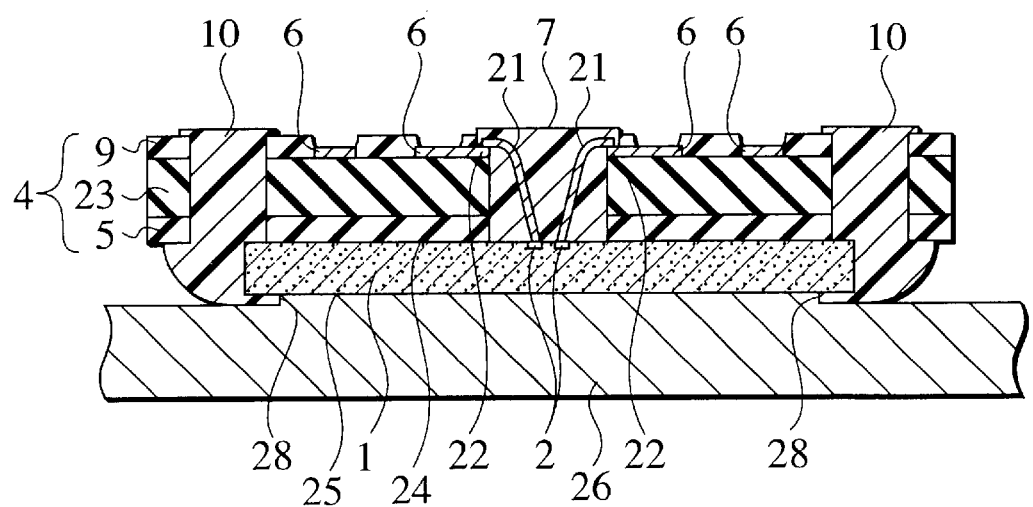
FIG. 8B is a cross sectional view of the I—I direction of FIG. 8A.

Next, a manufacturing method of the semiconductor device according to the third embodiment will be explained below. According to the manufacturing method of the semiconductor device according to the third embodiment, by changing the shape of the mold 26 to be arranged as shown in FIG. 8A and FIG. 8B in the step (3), it is possible to execute the manufacturing method of the semiconductor device according to the third embodiment in the same way as the manufacturing method of the semiconductor device according to the first embodiment. A side face 28 is newly provided to the mold 26. One end of the side face 28 is capable of being arranged in the vicinity of the corner portion of the second surface 25 of the semiconductor chip 1. In other words, it is possible that the mold 26 does not contact with the second surface 25 of the semiconductor chip 1 in the vicinity of the corner portion of the second surface 25. Further, it is possible that the mold 26 contacts with the second surface 25 of the semiconductor chip 1 if the mold 26 is separated from the corner portion of the second surface 25.

By changing the height of the side face 28, it is possible to set the thickness of the second resin 10 on the second surface 25 of the semiconductor chip 1 as an arbitrary thickness. Therefore, it is possible to set the thickness of the second resin 10 on the second surface 25 of the semiconductor chip 1 as the maximum thickness of the film so that, in the case of installing the semiconductor device in a socket, it does not become an obstacle against this installation.

Fourth Embodiment

In the fourth embodiment, a semiconductor device having the constitution A will be described in detail.

Figure 9A:
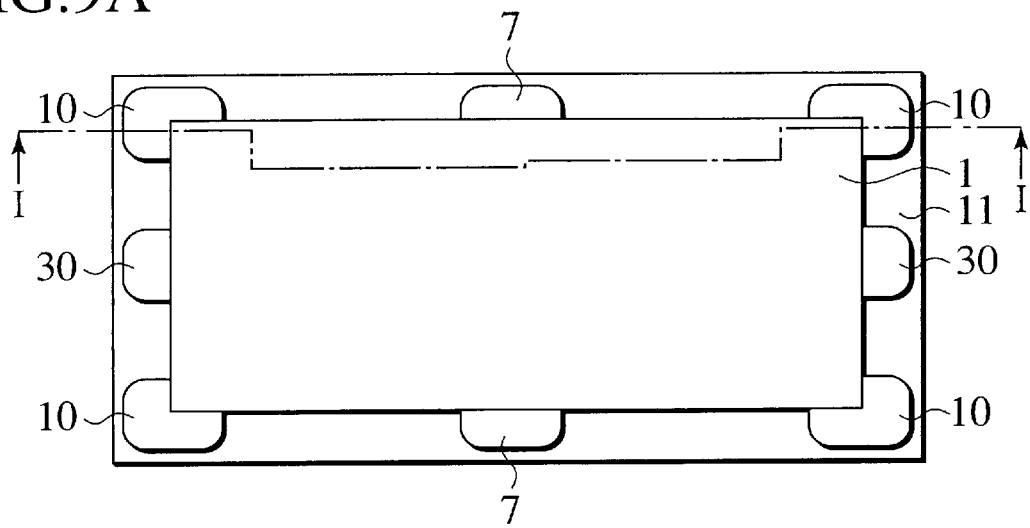
FIG. 9A is a top view of a semiconductor device according to a fourth embodiment.
Figure 9B:
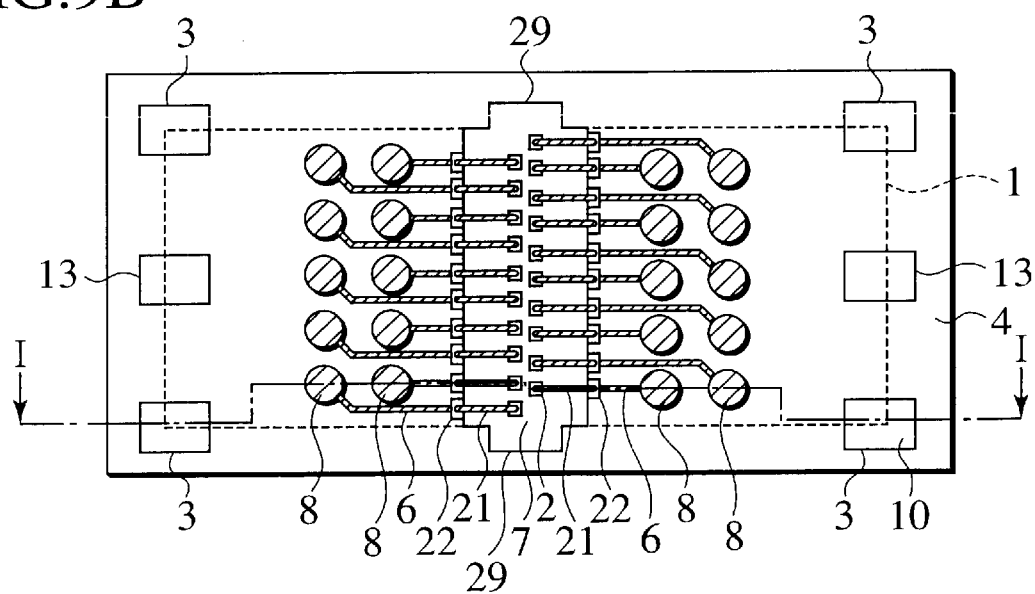
FIG. 9B is a bottom view of a semiconductor device according to a fourth embodiment.
Figure 9C:
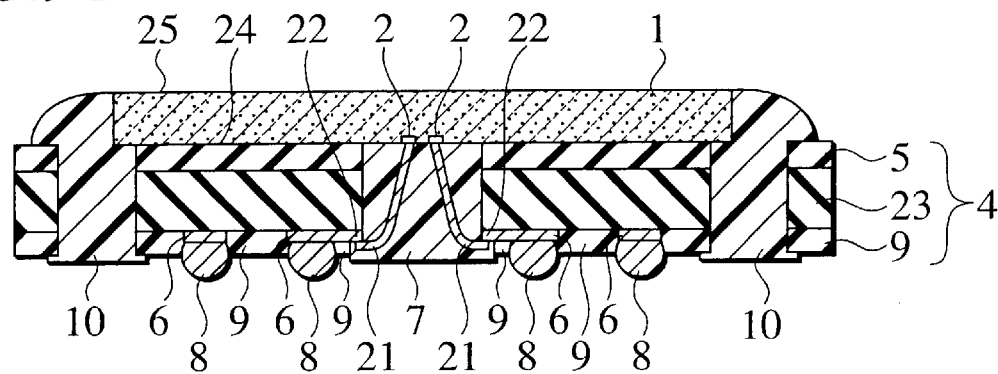
FIG. 9C is a cross sectional view in the I—I direction of FIG. 9A and FIG. 9B.

As shown in FIG. 9A, FIG. 9B and FIG. 9C, the semiconductor device according to the fourth embodiment is different from the semiconductor device according to the first embodiment in that the length of the first opening 29 is longer that of the semiconductor chip 1. Hereby, it is possible to arrange a side of a square on the first surface 24 of the semiconductor chip 1 on the first opening 29. The first resin 7 is provided on the first opening 29 and then, the first resin 7 is arranged on the side face of the semiconductor chip 1.

Alternatively, the semiconductor device according to the fourth embodiment is different from the semiconductor device according to the first embodiment in that the third opening 13 is provided on the circuit board 4 in the vicinity of a side of the square on the first and second surfaces 24, 25 of the semiconductor chip 1. A third resin 30 is provided on the third opening 13. Then, the third resin 30 is arranged on the side face of the semiconductor chip 1.

By providing the third opening 13 corresponding to the side face of the circuit board 4, the sealing resin 30 is also applied to the side faces other than the corner portion of the semiconductor chip 1. This resin 30 is injected into the opening 13 by the step same as the step for injecting the first and the second resins 7 and 10 according to the first embodiment. Alternatively, the constitution of the wire 6 in the vicinity of the center pad 2 and the constitution of the first resin 7 are as same as the first embodiment. The upper surfaces of the first to third resins 7, 10 and 30, which are provided in respective openings 29, 3 and 13 in the vicinity of the center pad 2, have heights substantially equal to that of the second surface 25 of the semiconductor chip 1 even in places where these upper surfaces are distanced from the corner portions of the square of the second surface 25 of the semiconductor chip 1. In other words, the first to the third resins 7, 10 and 30 having thicknesses equivalent to the thickness of the semiconductor chip 1 are provided in the first to the third openings 29, 3 and 13, respectively.

According to the second embodiment, in addition to the effect of the first embodiment, it is possible to prevent damage on the basis of the stress from the side portion of the semiconductor chip 1. Further, it is possible to make the strength of the corner portions of the semiconductor chip 1 greater than the peeling strength of the circuit board 4 and the semiconductor chip 1. Further, even if the load is provided on the second surface 25 of the semiconductor chip 1, the stress generated by the load is dispersed by a plurality of resins 7, 10 and 30, which are provided on the side face and the corner portion. Hereby, it is possible to prevent damage to the semiconductor chip 1.

Next, a manufacturing method of the semiconductor device according to the fourth embodiment will be explained below. It is possible to execute the manufacturing method of the semiconductor device according to the fourth embodiment in the same way as the manufacturing method of the semiconductor device according to the first embodiment by providing the openings 13 and 29 in the circuit board 4 according to the step (1). According to the step (3), it is possible to use the same mold 26 as that according to the first embodiment.

Fifth Embodiment

In the fifth embodiment, a semiconductor device having the constitution B will be described in detail.

Figure 10A:
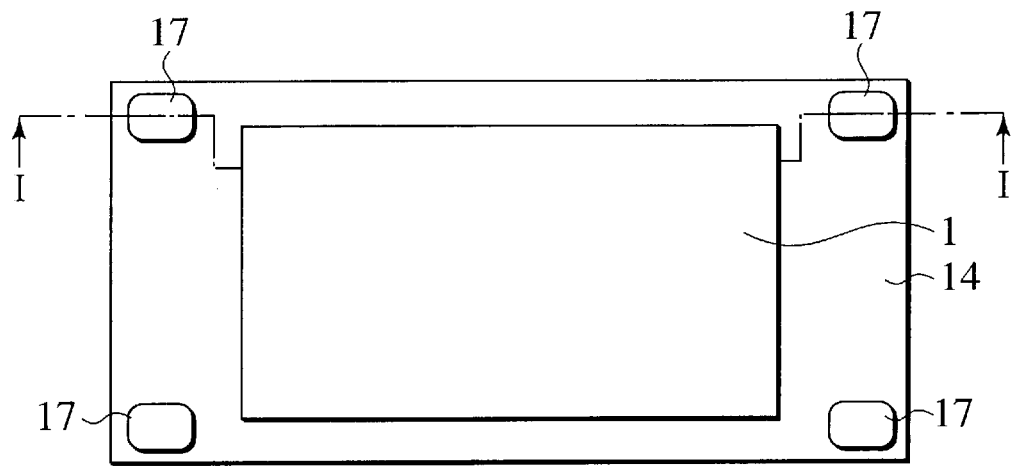
FIG. 10A is a top view of a semiconductor device according to a fifth embodiment.
Figure 10B:
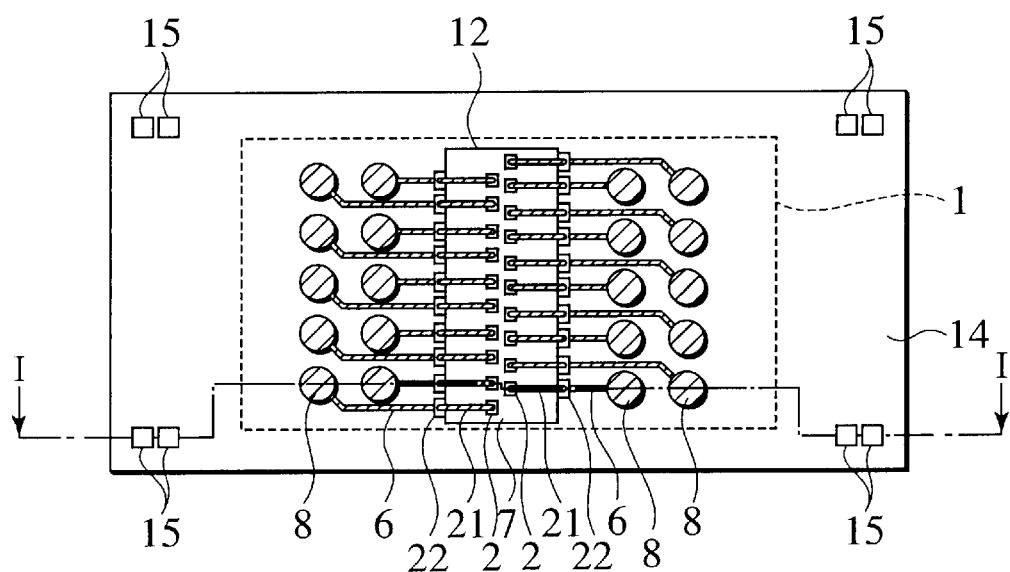
FIG. 10B is a bottom view of a semiconductor device according to a fifth embodiment.
Figure 10C:
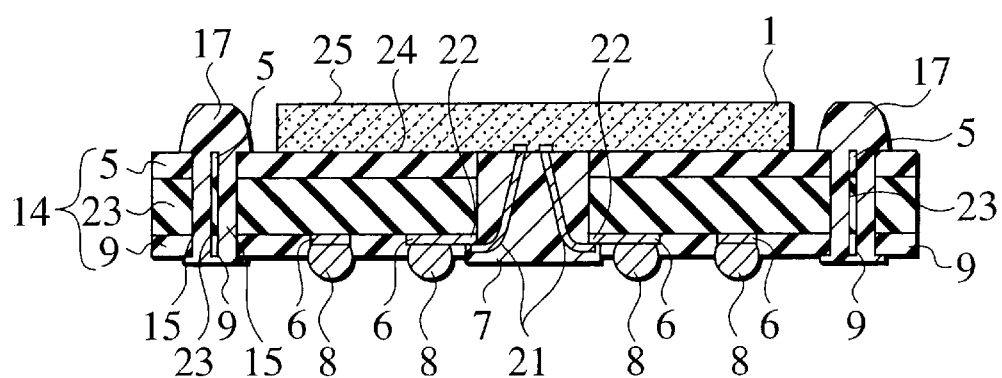
FIG. 10C is a cross sectional view in the I—I direction of FIG. 10A and FIG. 10B.

As shown in FIG. 10A, FIG. 10B and FIG. 10C, the semiconductor device according to the fifth embodiment is different from the semiconductor device according to the first embodiment in that the second resin 17 does not contact with the semiconductor chip 1. Particularly, the second resin 17 does not contact with the outer periphery of the second surface 25. This arises from the fact that the corner portion of the square of the first surface 24 of the semiconductor chip 1 is not arranged on the second opening 15. This also enables damage to the corner portion of the square of the semiconductor chip 1 to be prevented. Further, the semiconductor device according to the fifth embodiment is different from the semiconductor device according to the first embodiment in that the second opening 15 has two openings. As a result, it is possible to decrease the reducing of strength of the circuit board 4.

The upper surface of the second resin 17 to be provided on the second opening 15 has a height substantially equal to that of the second surface 25 of the semiconductor chip 1 even in places where the upper surface of the second resin 17 is distanced from the corner portion of the square of the second surface 25 of the semiconductor chip 1. In other words, the second resin 17 having a thickness equivalent to the thickness of the semiconductor chip 1 is provided in the second opening 15.

The second opening 15 is not provided on each corner portion of the semiconductor chip 1, however, a plurality of second openings 15 are provided on respective corner portions. The sum of the areas of the second openings 15, which are provided on respective corner portions, approximates to the area of the openings at respective corner portions according to the first embodiment.

The second opening 15 is provided on a circuit board 14, being separated from the semiconductor chip 1. In this second opening 15, the second resin 17 is sealed. The corner portion of the semiconductor chip 1 does not contact with the second resin 17. The height of the second resin 17 is the same as the height of the second surface 25 of the semiconductor chip 1. The second resin 17 is injected from a face at the opposite side of the face on which the semiconductor chip 1 of the circuit board 14 is mounted, as well as the first resin 7. Therefore, on the face on which the semiconductor chip 1 of the circuit board 14 is mounted, the bottom face of the second resin 17 comprises a projection, which is larger than the second opening 15. Further, the constitutions of the wire 6 in the vicinity of the center pad 2 and the first resin 7 are the same as those according to the first embodiment.

In the vicinity of the center portion of the circuit board 14, the semiconductor chip 1 is mounted. Four projections 17 are provided around the circuit board 14, being separated from the semiconductor chip 1. The second resin 17 has the projection 17 and the projection 17 has a height equivalent to the thickness of the semiconductor chip 1 or substantially equal to it. Due to this projection 17, the semiconductor chip 1 hardly contacts the outside, so that damage of the semiconductor chip 1 is prevented.

Next, a manufacturing method of a semiconductor device according to the fifth embodiment will be explained. It is possible to execute the manufacturing method of the semiconductor device according to the fifth embodiment in the same way as the manufacturing method of the semiconductor device according to the first embodiment by providing the opening 15 in the circuit board 14 according to the step (1). According to the step (3), it is possible to use the same mold 26 as that according to the first embodiment.

Sixth Embodiment

In the sixth embodiment, a semiconductor device having a constitution between the constitution A and the constitution B will be described in detail.

Figure 11A:
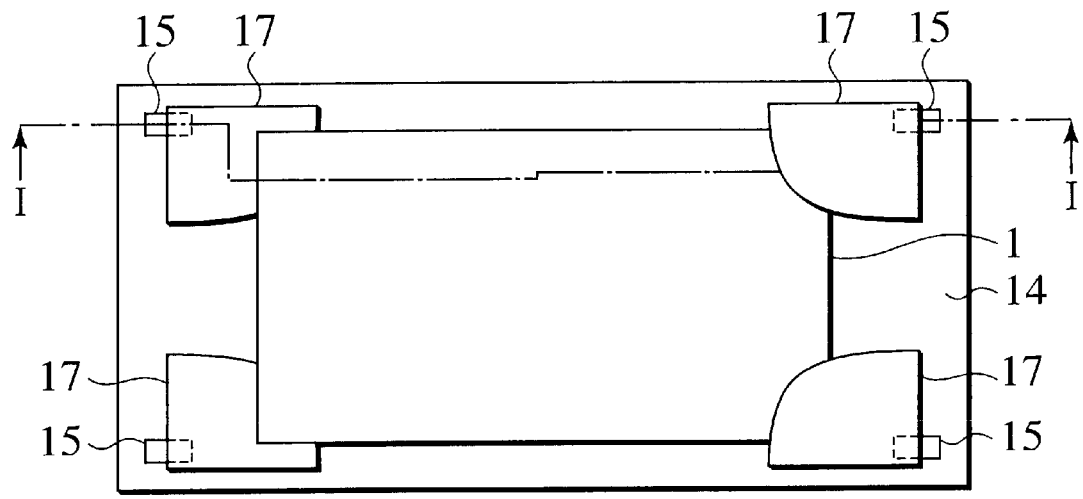
FIG. 11A is a top view of a semiconductor device according to a sixth embodiment.
Figure 11B:
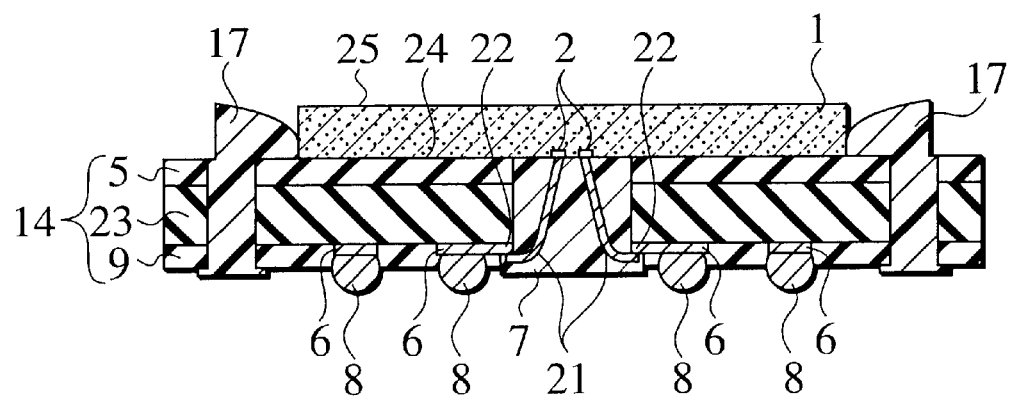
FIG. 11B is a cross sectional view of the I—I direction of FIG. 11A.

As shown in FIG. 11A and FIG. 11B, the semiconductor device according to the sixth embodiment is different from the semiconductor device according to the first embodiment in that the second resin 17 contacts with the semiconductor chip 1 but does not contact with the outer periphery of the second surface 25. This arises from the fact that the corner portion of the square of the first surface 24 of the semiconductor chip 1 is not arranged on the second opening 15. This also enables damage to the corner portions of the square of the semiconductor chip 1 to be prevented.

The upper surface of the second resin 17 has a height substantially equal to that of the second surface 25 of the semiconductor chip 1 even in places where the upper surface of the second resin 17 is apart from the corner portion of the square of the second surface 25 of the semiconductor chip 1. In other words, the second resin 17 has a thickness equivalent to the thickness of the semiconductor chip 1. Due to this second resin 17, the semiconductor chip 1 hardly contacts with the outside so that it is possible to prevent damage to the semiconductor chip 1.

Figure 12A:
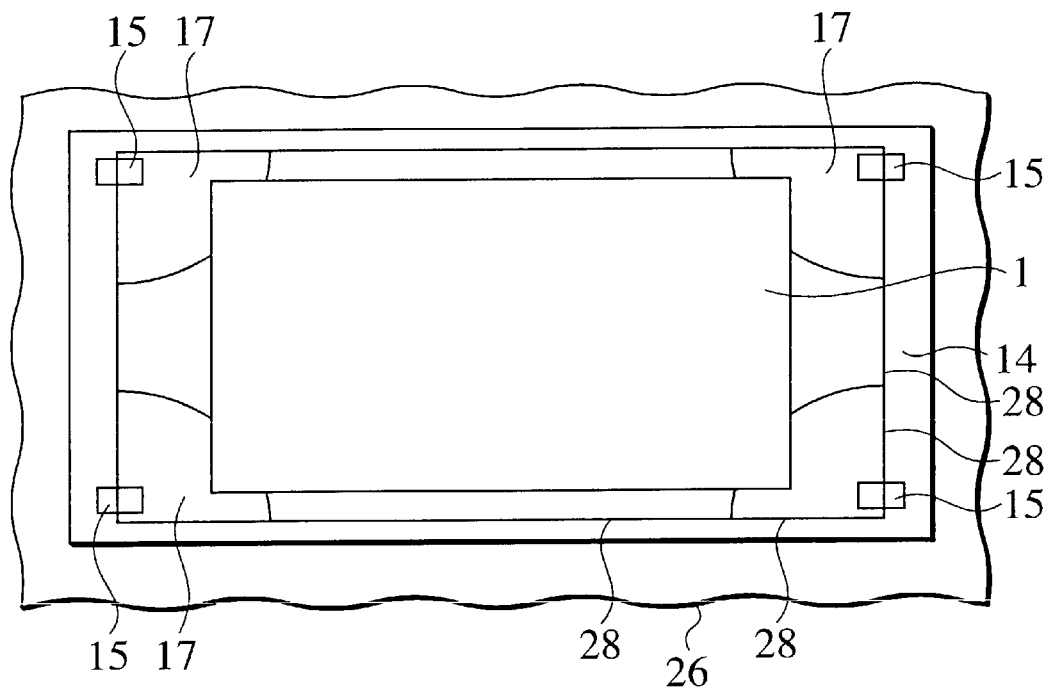
FIG. 12A is a transparent view of a semiconductor device from beneath according to the sixth embodiment during a manufacturing process.
Figure 12B:
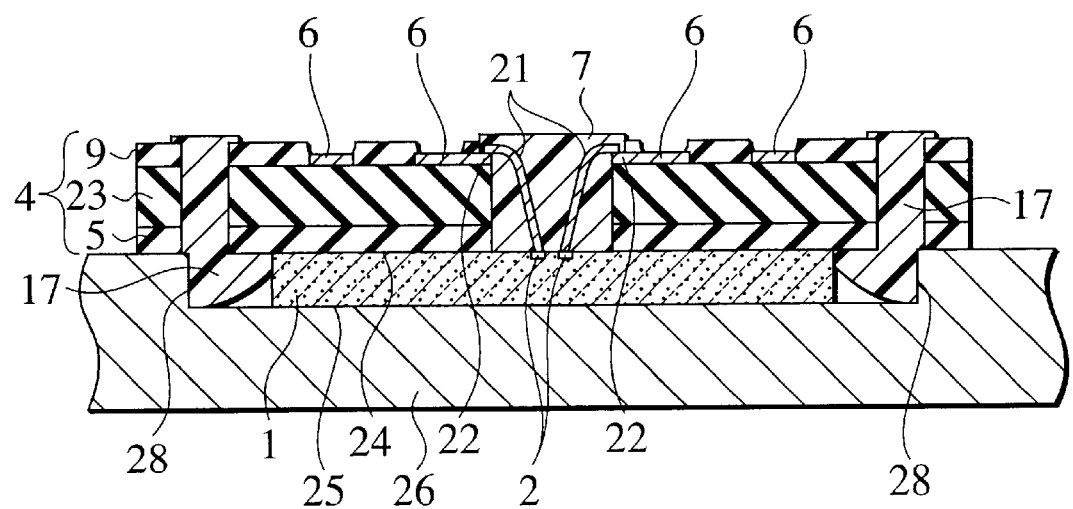
FIG. 12B is a cross sectional view of a semiconductor device according to the sixth embodiment during a manufacturing process.
Figure 13A:
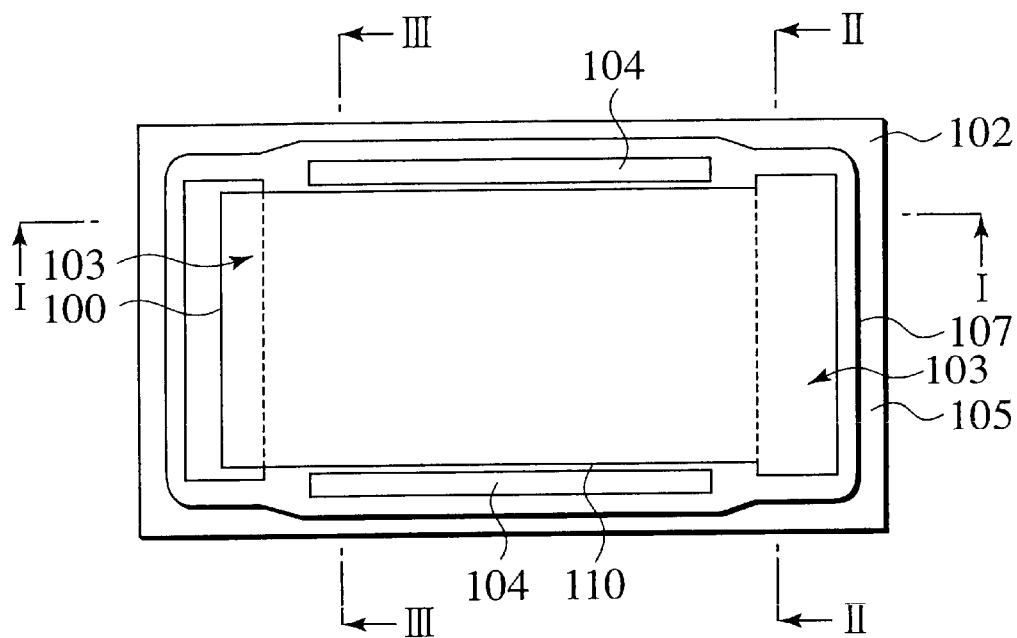
FIG. 13A is a top view of a semiconductor device according to a seventh embodiment.
Figure 13B:
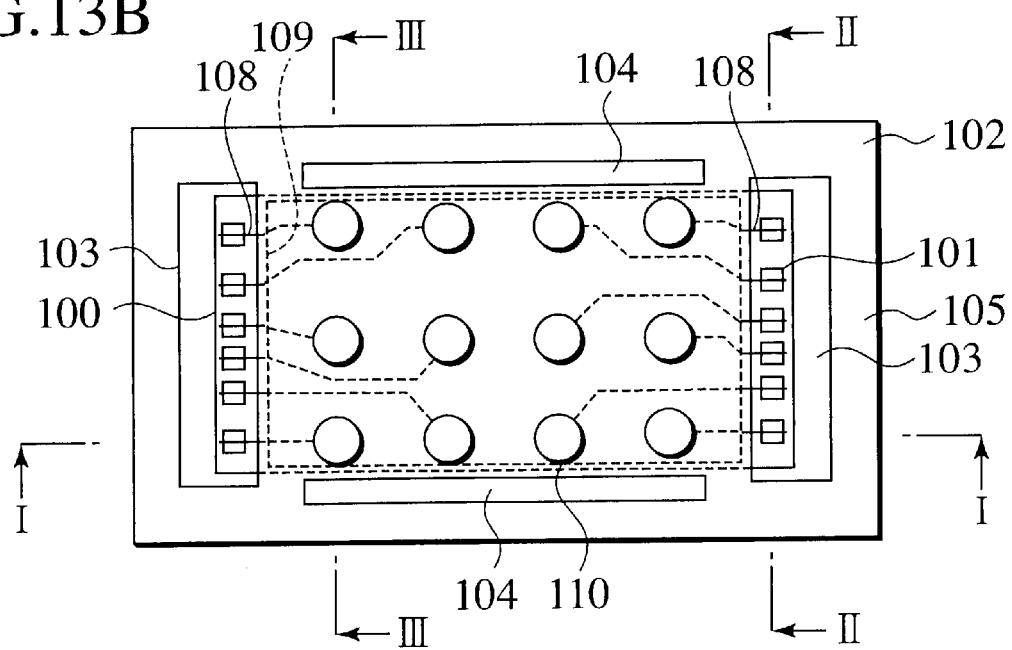
FIG. 13B is a transparent view of a semiconductor device from beneath according to the seventh embodiment.
Figure 14A:
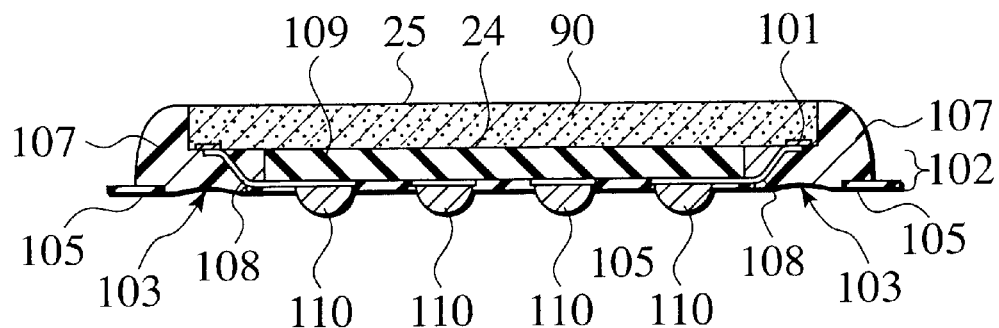
FIG. 14A is a cross sectional view in the I—I direction of FIG. 13A and FIG. 13B.
Figure 14B:
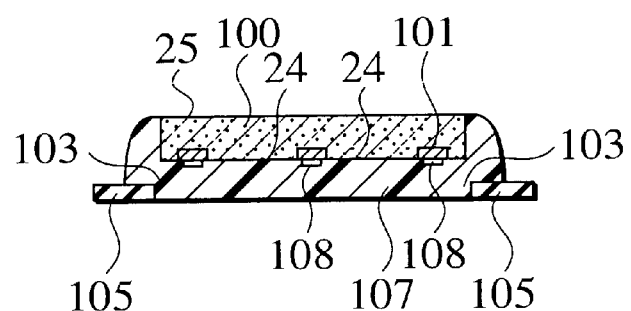
FIG. 14B is a cross sectional view in the II—II direction of FIG. 13A and FIG. 13B.
Figure 14C:
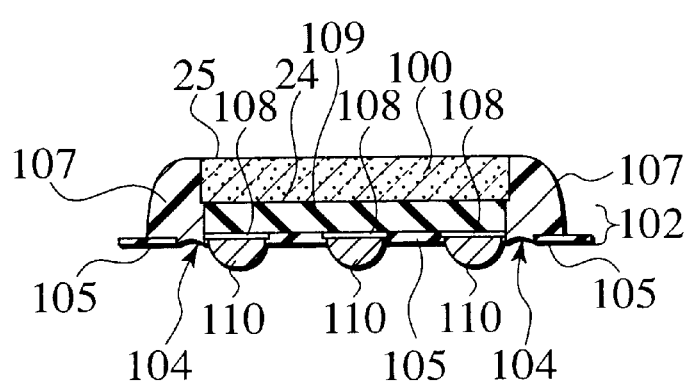
FIG. 14C is a cross sectional view in the III—III direction of FIG. 13A and FIG. 13B.

Next, a manufacturing method of the semiconductor device according to the sixth embodiment will be explained below. It is possible to execute the manufacturing method of the semiconductor device according to the sixth embodiment in the same way as the manufacturing method of the semiconductor device according to the first embodiment by changing the following two points. First, the opening 15 is arranged in the circuit board 14 in the step (1). Secondly, as shown in FIG. 12A and FIG. 12B, the shape of the mold 26 is changed and arranged in the step (3). In this case, FIG. 12A is a transparent view of a semiconductor device according to the sixth embodiment, in which the mold 26 is arranged from above. FIG. 12B is a cross sectional view of a semiconductor device according to the sixth embodiment, in which the mold 26 of FIG. 12A is arranged. A side face 28 is newly provided to the mold 26. The side face 28 is capable of being arranged perpendicularly to the second surface 25 of the semiconductor chip 1. Therefore, the side face 28 is arranged perpendicularly to the flat face of the mold 26 contacting the second surface 25 of the semiconductor chip 1. One end of the side face 28 is capable of being arranged below the second opening 15. Therefore, it is possible to arrange the second resin 17 on the side face 28. One end of the side face 28 is capable of contacting one end of the circuit board 4. Therefore, the height of the side face 28 is defined as same as the thickness of the semiconductor chip 1.

Seventh Embodiment

In the seventh embodiment, a semiconductor device having the constitution A will be described in detail.

As shown in FIG. 13A and FIG. 13B and FIG. 14A, FIG. 14B and FIG. 14C, the semiconductor device according to the seventh embodiment is different from the semiconductor device according to the first embodiment in that a pad 101 of a semiconductor chip 100 is provided in the vicinity of a side of the square of the first surface 24 of the semiconductor chip 100. A first opening 103 serves as the first opening 12 and the second opening 3. The semiconductor device of the seventh embodiment is different from the semiconductor device of the first embodiment in that the third opening 104 is provided on the circuit board 102 in the vicinity of a side of a square on the first surface 24 of the semiconductor chip 100. The first resin 107 is provided on the first opening 103 and the third opening 104. The first resin 107 is arranged on the side face of the semiconductor chip 100. The shape of the opening face of the third opening may be a circle, a square or a polygon. The third opening may be a plurality of openings.

By providing the first resin 107, the corner portion of the semiconductor chip 1 hardly contacts with the inspection device and the tray. Further, it is possible to prevent damage to the corner portion of the semiconductor chip 1.

A plurality of pads 101 are provided on the periphery of the first surface 24 of the semiconductor chip 100. The semiconductor chip 100 is mounted to the circuit board 102. In association with four sides of the semiconductor chip 100, the openings 103 and 104 are provided to the circuit board 102. The wire 108 between the semiconductor chip 100 and the connection ball 108 on the circuit board 102 is coated by the resin 107 for protection.

The circuit board 102 has a lamination layer of an elastomer 109 and an insulating base material 105. The circuit board 102 has the first openings 103 capable of being arranged below a pair of opposing sides of the semiconductor chip 100, respectively. Then, above the first opening 103, an electrode pad 101 is arranged. The circuit board 102 has the third openings 104 capable of being arranged in the vicinity of other pair of opposing sides of the semiconductor chip 100, respectively.

The sealing resin 107 is applied from the lower side of the circuit board 102 through the opening 103 and the opening 104 for sealing. Thus, four side faces of the semiconductor chip 100, and particularly, the sealing resin 107 coats the corner portions.

The wire 108 is connected to the pad 101 on the semiconductor chip 100. This wire 108 electrically connects the semiconductor chip 100 and the circuit board 102. The wire 108 is provided below the elastomer 109. The wire 108 is electrically connected to the solder bump 110. The semiconductor chip 100 is arranged on the circuit board 102 so that the second surface 25 is upside of the semiconductor chip 100. A circuit element is formed on the first surface 24 of the semiconductor chip 100.

Figure 15A:
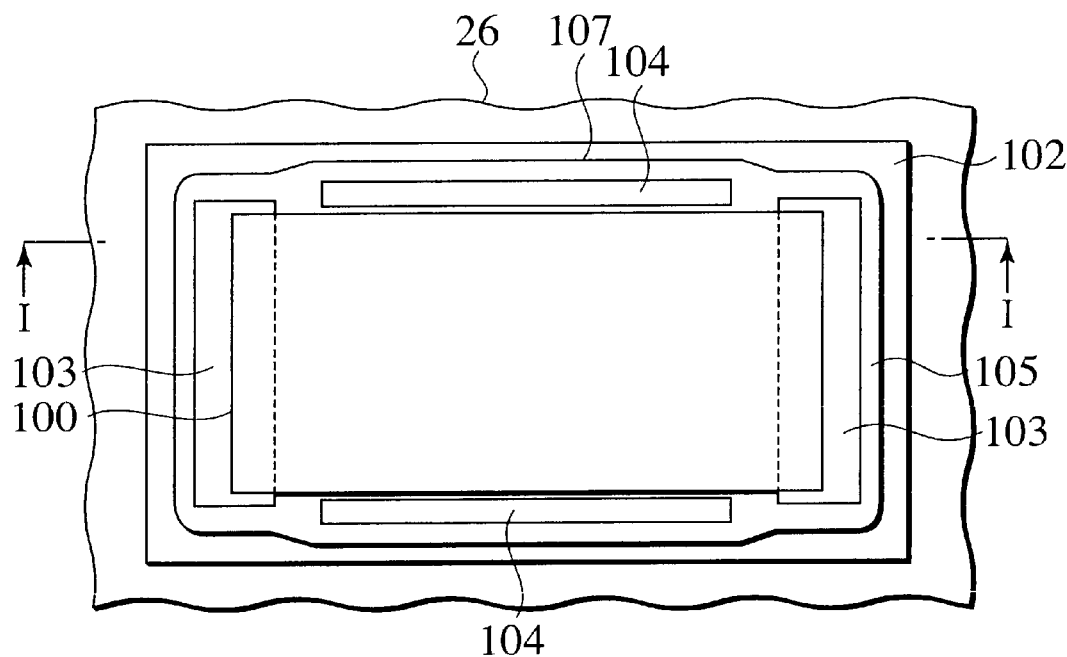
FIG. 15A is a transparent view from above of a semiconductor device according to the seventh embodiment, in which a mold 26 is arranged.
Figure 15B:
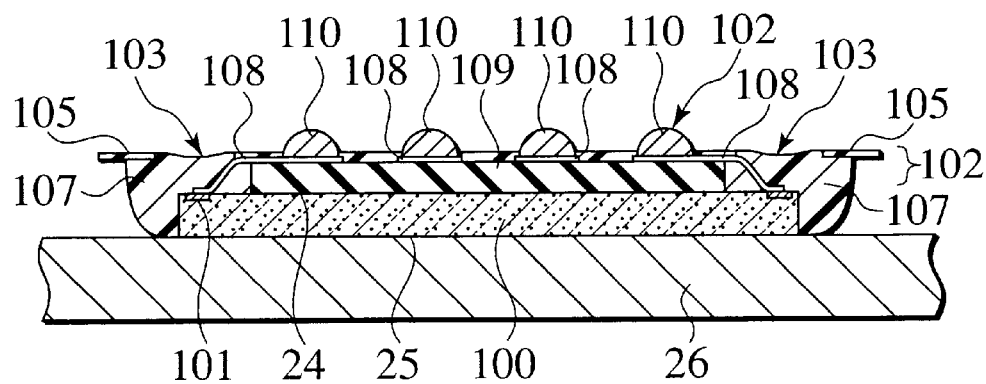
FIG. 15B is a cross sectional view of a semiconductor device according to the seventh embodiment, in which a mold 26 is arranged.

Next, a manufacturing method of the semiconductor device according to the seventh embodiment will be explained. It is possible to execute the manufacturing method of the semiconductor device according to the seventh embodiment in the same way as the manufacturing method of the semiconductor device according to the first embodiment by providing the openings 103 and 104 on the circuit board 102. In the step (3), as shown in FIG. 15A and FIG. 15B, the same mold 26 as in the first embodiment is capable of being used.

The present invention may be embodied in other specific forms without departing from the spirit or essential characteristics hereof The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:
   a semiconductor chip including a pad disposed on a square first surface;
   a circuit board including upper surface contacting the first surface of said semiconductor chip, including a first opening arranged below the pad, and including a wire arranged on a lower surface and electrically connected to the pad;
   a first resin arranged on the first opening and coating the pad; and
   a second resin disposed on the upper surface of said circuit board, and including an upper surface at a height substantially equal to a height of a second surface of said semiconductor chip at a point apart from a corner of the square first surface of said semiconductor chip.

2. The semiconductor device as claimed in claim 1, wherein a second opening is provided on said circuit board in a vicinity of the corner of the square first surface of said semiconductor chip, and said second resin is provided in said second opening.

3. The semiconductor device as claimed in claim 2, wherein the corner of the square first surface of said semiconductor chip is arranged over said second opening.

4. The semiconductor device as claimed in claim 2, wherein the pad is provided in a vicinity of a side of the square first surface, and the first opening serves as the second opening.

5. The semiconductor device as claimed in claim 2, wherein a shape of an opening face of the second opening is a circle, a square or a polygon.

6. The semiconductor device as claimed in claim 2, wherein the second opening has a plurality of openings.

7. The semiconductor device as claimed in claim 1, wherein the upper surface of said second resin and the second surface of said semiconductor chip are arranged on a plane.

8. The semiconductor device as claimed in claim 1, wherein said second resin contacts with a periphery of the second surface of said semiconductor chip.

9. The semiconductor device as claimed in claim 1, wherein a side of the square first surface of said semiconductor chip is arranged over said first opening.

10. The semiconductor device as claimed in claim 1, wherein the pad is arranged in the vicinity of a centerline perpendicular to a side of the square first surface.

11. The semiconductor device as claimed in claim 1, wherein a third opening is provided on said circuit board in the vicinity of a side of the square first surface, a third resin is provided in the third opening, and the third resin is arranged on a side face of said semiconductor chip.

12. The semiconductor device as claimed in claim 11, wherein a shape of an opening face of the third opening is a circle, a square or a polygon.

13. The semiconductor device as claimed in claim 11, wherein the third opening has a plurality of openings.

14. The semiconductor device as claimed in claim 1, wherein said semiconductor device including a bump arranged below the wire and electrically connected to the wire.

15. The semiconductor device as claimed in claim 1, wherein the pad is electrically connected to the wire by a wire.

* * * * *